United States Patent [19]

Armstrong et al.

[11] Patent Number: 4,994,162
[45] Date of Patent: Feb. 19, 1991

[54] PLANARIZATION METHOD

[75] Inventors: Karl J. Armstrong, Congers; Arnold J. Aronson, Pomona; Jon A. Roberts, Suffern, all of N.Y.

[73] Assignee: Materials Research Corporation, Orangeburg, N.Y.

[21] Appl. No.: 415,083

[22] Filed: Sep. 29, 1989

[51] Int. Cl.$^5$ ............................................. C23C 14/34
[52] U.S. Cl. ........................... 204/192.15; 204/192.12; 204/192.3
[58] Field of Search ........... 204/192.15, 192.3, 192.32, 204/298.06, 298.08, 192.12

[56] References Cited

U.S. PATENT DOCUMENTS 4,816,126  3/1989  Kamashida et al. ............. 204/192.3

*Primary Examiner*—Nam X. Nguyen
*Attorney, Agent, or Firm*—Wood, Herron & Evans

[57] ABSTRACT

A three step planarization method for planarizing aluminum or aluminum alloy in via and trench features of a wafer includes first, high rate deposition in the absence of heat, followed by low rate deposition in the presence of heat, and finally, high rate deposition with continued supply of heat to the wafer. Bias may be used. Deposition is preferably continuous and uninterrupted from the beginning of the first step until the end of the third step. The first step is limited in duration in order to produce a relatively thin layer which geometrically covers the inside surfaces of the feature. The duration of the second step is selectable, but is preferably based upon the temperature of the heat applied to the wafer and a characteristic size of the feature. The third step deposition completes the thickness of the film.

19 Claims, 5 Drawing Sheets

PLANARIZATION METHOD

This invention relates to solid state electronic devices and more specifically to a method of planarizing or enhancing step coverage of aluminum or aluminum alloy into via and trench features of a wafer in order to manufacture such a device.

BACKGROUND OF THE INVENTION

The manufacture of solid state electronic devices involves the layering of various materials in a prescribed pattern upon a wafer. Oftentimes the topography of the prescribed pattern is not flat, and manufacture of these devices requires the planarization of windows with a particular material prior to formation of the next layer. These windows are referred to as "via" or "trench" features. Vias are basically square or circularly shaped holes of a particular depth in the top surface of the wafer. Trenches are generally elongated and rectangularly shaped.

In order for these types of final solid state electrical devices to function properly, it is critical that the via and trench features be planarized, or in some applications, that the sidewall coverage be enhanced beyond that obtained from currently available geometric coating. That is, the features must be filled or nearly filled with the desired material, such as aluminum or aluminum alloy, in a manner which leaves no voids within the feature. This task becomes increasingly difficult as the depth of the feature increases with respect to the width of the feature. The ratio of the depth of a feature with respect to its width is referred to as its "aspect ratio."

One conventional manner of metalizing a wafer involves sputtering the material from a target of material mounted opposite the wafer in a sealed enclosure. Sputtering methods and apparatus are well known, and Applicants' commonly assigned currently pending patent application Ser. No. 07/222,328 is expressly incorporated by reference herein in its entirety for the purpose of providing background information on such an apparatus. During sputtering, the target is biased negatively with respect to the chamber. An inert gas passes through the enclosure and is ionized to form a plasma. The potential difference between the target and the plasma causes ions from the gas to bombard the target, thereby sputtering the target material. Some of the sputtered material is deposited onto the wafer.

Sputtering of a material such as aluminum or aluminum alloy from a target onto an oppositely mounted, flat wafer surface will result in a deposition of substantially uniform thickness. However, if there are via or trench features to be metalized, and particularly if the features have a relatively high aspect ratio, i.e., about 0.9 or higher, the build up of material deposited upon the sides and the ledges of the feature tends to block or prevent the unobstructed path of subsequently deposited material into the bottom of the feature. This effect is referred to as "shadowing," and results in the reduction of metal thickness on feature sidewalls, or the formation of voids or incomplete filling of the feature.

Various attempts have been made to prevent or to reduce the effects of shadowing. Such attempts include, among others, movement of the wafer with respect to the target, movement of the target with respect to the wafer, variations in the shape of the target and variations in the shape and strength of the magnetic field located near the target surface. Other attempts involve variation in deposition parameters at the wafer surface. These latter methods attempt to produce thorough planarization by movement or diffusion of the already deposited material into the features through the application of heat or bias to the wafer.

It is well known that heat affects the mobility of a material that has been deposited upon a wafer. For example, Mintz U.S. Pat. No. 4,661,228 discloses an apparatus and method for producing planarized aluminum films on a semiconductor wafer wherein the wafer is heated to temperatures above 400° C. during sputtering. However, as reported in an article entitled "Sputtering . . . Plus TM " by the technical staff of the Machine Technology, Inc. Thin Film Equipment Division, use of heat alone to planarize aluminum results in an undesired increase in grain size. Thus, while heating the wafer may produce the enhanced aluminum mobility that is required to adequately planarize a feature, it does so in a manner which produces undesired grain growth Another method of improving mobility during planarization involves the use of intermittent or continuous terms of resputtering, in which the electrical bias of the wafer with respect to the plasma is reversed so that some of the aluminum deposited upon the wafer will subsequently be sputtered from the wafer. In effect, resputtering produces a migration or rearrangement of the deposited aluminum into the feature. However, resputtering reduces the overall rate of aluminum deposition onto the wafer, thereby slowing down the entire planarization process and the total throughput time for wafer treatment. Moreover, for features with relatively high aspect ratios, resputtering alone does not produce enough surface migration to fill the feature in an acceptable manner.

An article entitled "Planarization of Metal Using Bias Sputtering" by J. Hems and Abe McGeown of ElectroTech in Bristol, England cites the use of thermal pulses and metal lift off processes to achieve planarization of a wafer, but the article also states that these methods also require extra processing steps.

Thus, there is a recognized need to provide improvements in planarization techniques, particularly with respect to aluminum or aluminum alloy planarization of via and trench features having a relatively high aspect ratio.

SUMMARY OF THE INVENTION

This invention contemplates a method for planarizing a feature that involves first, high rate deposition at a temperature below 200° C. in order to achieve a continuous coating on the internal surfaces of the feature, followed by low rate deposition while supplying heat to the wafer in order to enhance diffusion into the feature, and finally, high rate deposition with continued heat supplied to the wafer to reach the desired total thickness of metallization. The deposition is optimally continuous and uninterrupted throughout all three steps, in order to prevent the formation of unwanted oxide layers that would otherwise occur during discontinuities in the process. A bias voltage may be applied to the wafer during this deposition.

The invention further contemplates a planarization technique whereby the duration of the intermediate, low rate, deposition step is selected in accordance with a maximum diffusion distance of the feature to be planarized and the temperature of the wafer.

To these ends, in accordance with a preferred embodiment of the invention, a planarization method includes an uninterrupted three step process. The first step involves the application of high power to a sputtering target to produce high rate deposition, e.g., about 220 Angstroms per second, of aluminum or aluminum alloy onto a wafer until a layer having a thickness of about 400 Angstroms to 1,000 Angstroms is obtained on the flat top surface of the wafer. Under a theoretical model to be described in more detail later, it is believed that this first step produces a continuous layer of about 200 Angstroms thick on the interior surfaces i.e., "geometric" coverage, of the side and bottom walls of the feature. The wafer temperature remains below 200° C. during this first step.

During the second step, power to the sputtering target is reduced to produce a low rate of deposition onto the wafer, e.g., about 44 Angstroms per second. Concurrently with the low rate deposition of the second step, an inert gas or fluid thermally connects a heated back plane to the rear of the wafer in order to raise the temperature of the deposition surface to a desired temperature on the order of 300° C. or greater. The duration of this second step and the wafer temperature during deposition are determined by a characteristic size of the feature to be planarized and the degree of planarization required. During the third step, power to the sputtering target is increased to produce high rate deposition, again on the order of 220 Angstroms per second, with continued application of heat to the wafer via fluid contact with the heated back plane. This high rate step is used to increase throughput for the process.

The first step of this inventive technique produces a thin continuous layer of aluminum or aluminum alloy on the wafer which enhances mobility during subsequent steps. During the second step, with an inert gas thermally connecting the back of the wafer to a heated backplane, the applied heat enhances the mobility of the material that has already been deposited during the first step, while also steadily providing additional deposition material to migrate into the feature. The slower deposition rate enables deposited atoms to move into the feature before being buried by subsequently deposited atoms.

The net movement of deposited material into the feature also occurs because filling of the feature results in a reduction of the surface area of the metal-to-vacuum interface, and therefore a reduction in the surface energy of the wafer. As substantial planarization occurs, the distance any given atom must diffuse in order to contribute to further reduction in surface area decreases. Thus, step coverage and fill factor increase as the thickness of the deposited material increases. During the third and final step, it is no longer necessary to rely wholly upon surface diffusion of atoms in order to continue the planarization, so high deposition rates can be used.

Using this technique, with a back plane temperature of about 450° C. during the second and third steps, via features of 3 microns wide and 1 micron deep, simultaneously with trench features of 1.5 microns wide and 1 micron deep, have been planarized on a TiN barrier using a target material of aluminum 2% copper with a thickness of only one micron.

These and other features of the invention will be more readily understood in view of the following detailed description and the drawings in which:

BRIEF DESCRIPTION OF THE DRAWINGS

FIG. 5 shows the nucleation of 250 Angstroms of pure aluminum deposited on a Ti/TiN/Ti barrier at 200° C.;

FIG. 6 shows the nucleation of 250 Angstroms of pure aluminum deposited on a Ti/TiN/Ti barrier at 300° C.;

FIG. 7 shows the nucleation of 250 Angstroms of pure aluminum deposited on a Ti/TiN/Ti barrier at 400° C.;

FIG. 8 shows the nucleation of 250 Angstroms of pure aluminum deposited on a Ti/TiN/Ti barrier at 500° C.;

DETAILED DESCRIPTION OF THE INVENTION

Figure 1:
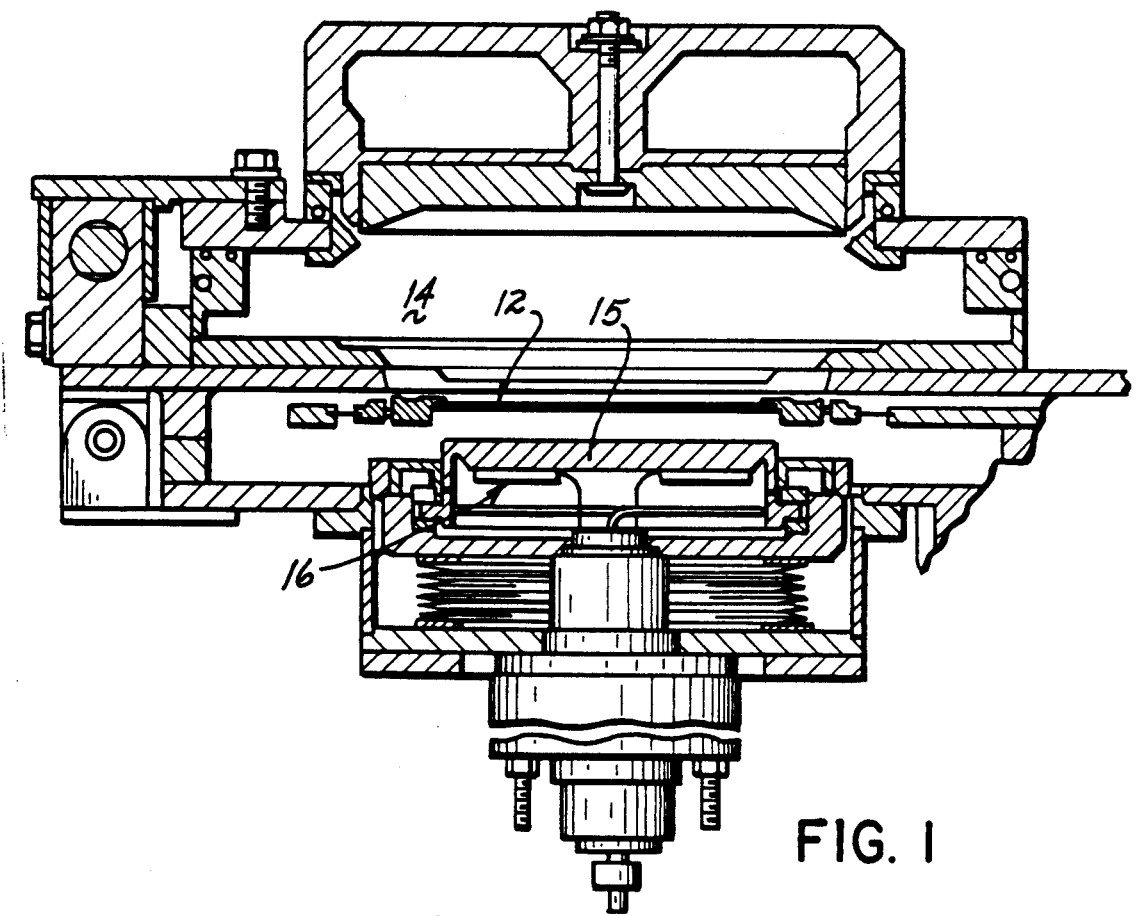
FIG. 1 is a cross sectional view of a sputter/deposition apparatus used to carry out the inventive method.

FIG. 1 is a cross sectional view of a magnetron sputtering apparatus 10 that can be used to deposit aluminum or aluminum alloy upon exposed surfaces of a wafer 12. The deposition material, i.e., the aluminum or the aluminum alloy, comprises a target 13 mounted opposite the wafer 12, both enclosed within a vacuum chamber 14. As mentioned previously, during sputtering an inert gas is passed through chamber 14.

The apparatus 10 also includes a backplane member 15 and means 16 for heating the backplane member 15. Backplane member 15 is movable toward wafer 12 sufficiently close to form a seal tight enough to allow a thermally conducting gas layer to exist in the space 17 between wafer 12 and the backplane 15. By regulating the heat of the backplane member 15, through the withholding from or introducing into the space 17 an inert gas such as Argon, the temperature of the wafer 12 can be precisely controlled. The gas presence serves as a thermal conduit. The timing of the heat application can also be precisely controlled. This feature is of significant importance in the three step planarization method in accordance with a preferred embodiment of the invention because it enables precise control of the timing of heat applied to the wafer 12.

Figure 2:
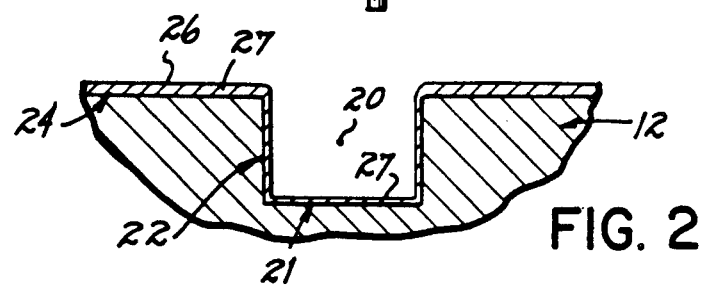
FIG. 2 is a cross sectional view which schematically shows a typical feature of a wafer after the first step in accordance with a preferred embodiment of the inventive method.
Figure 3:
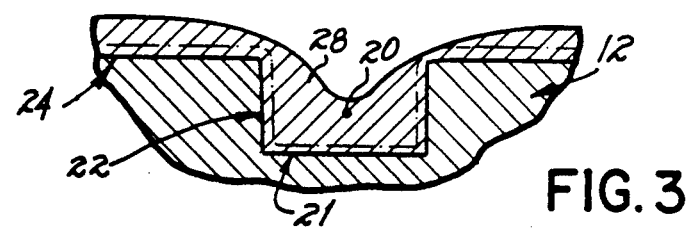
FIG. 3 is a cross sectional view which schematically shows a typical feature of a wafer after a second step in accordance with a preferred embodiment of the inventive method.
Figure 4:
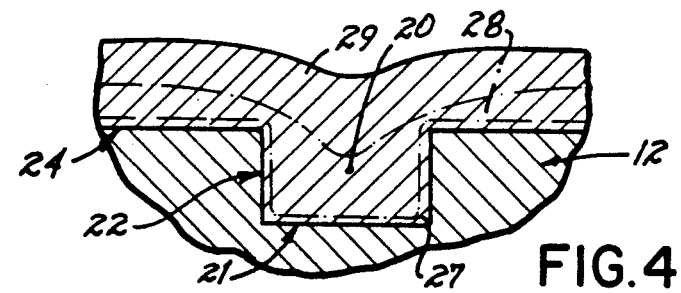
FIG. 4 is a cross sectional view which schematically shows a typical feature of a wafer after a third step in accordance with a preferred embodiment of the inventive method.

FIGS. 2, 3 and 4 schematically show the progressive planarization of a feature 20 during the first, second and third steps, respectively, in accordance with the invention. The feature 20 has a bottom surface 21 and side surfaces 22. During the first step, shown in FIG. 2, aluminum or aluminum alloy is deposited in a substantially uniform manner upon the top flat surface 24 of the wafer 12 and also upon the inside surfaces 21 and 22 of the feature 20 to form an initial layer 27. As will be explained in more detail later, coverage of the inside surfaces during this first step is "geometric." During the second step, as shown in FIG. 3, some of the aluminum that is being deposited will move into the via 20 to form the second layer 28. During the third step, as shown in FIG. 4, the aluminum moves into the feature 20 until substantial planarization has occurred, to form the complete deposition layer 29.

Studies of the initial deposition of aluminum showed that the metal tends to redistribute on a flat surface into "islands" during the first few hundred Angstroms of deposition. As shown in FIGS. 5 through 8, the island density increases with decreasing temperature. Conversely, as the temperature increases, the size of the islands increases and the spacing between adjacent islands also increases, or, in other words, the islands become less dense. In order to initially cover the interior surfaces of the features 20 with a relatively uniform, continuous film, the first step of this planarization method should be performed at relatively low temperature e.g., less than 200° C. Otherwise, the relatively larger islands generally cause shadowing in the lower parts of the feature, thereby impeding deposition below and tending to result in void formation during coating of the inside walls of the feature 20. It has been estimated that the average spacing of the islands is only about 100 A when deposited at room temperature. Therefore, a deposition thickness of 100 A–200 A will be composed of islands which have coalesced into a continuous film. This continuous film formed early in the deposition provides an optimum surface for the diffusing of material in the subsequent high temperature steps.

A model is utilized for estimating the maximum step coverage obtainable without redistribution of the deposition from the area surrounding it. This model assumes no shadowing and no redistribution, so it may be applied only for thin films at low temperatures. Hence, it may be used to determine the nominal thickness necessary for the first step of this process. In this model, it is assumed that all the deposited material which enters a feature becomes uniformly distributed over the inside surfaces of the feature, thus giving the maximum step coverage possible. The calculations involve a comparison of the cross sectional area of the feature 20 at the surface to the total surface area of the side and bottom walls of the feature. It is assumed that:

Volume of metal entering feature =     Eq I
Cross sectional area of feature at wafer surface ($A$) ×

Nominal deposition thickness on flat wafer surface ($T$);

-continued
and:
Volume of metal on inside surfaces of feature =     Eq II
Total feature surface area ($A + 4hw$) × thickness of metal in feature ($t$) (assumed to be uniform);

with step coverage defined as the ratio of the thickness of metal deposited in the feature to the nominal deposition thickness on the flat wafer surface (i.e., $t/T$).

Figure 9:
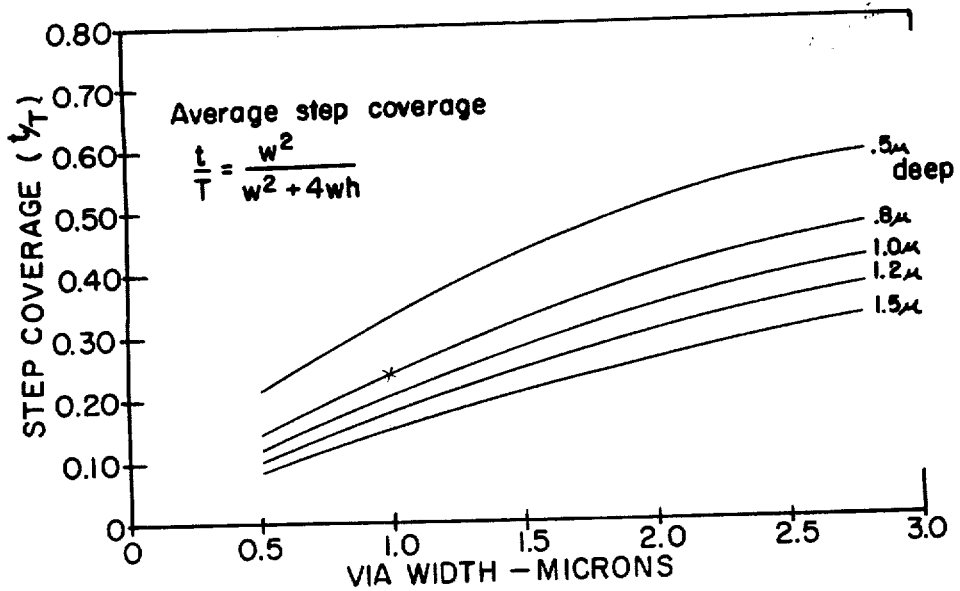
FIG. 9 is a graph which depicts theoretical maximum step coverage versus via width during deposition without mobility, for a square feature having width w, depth h and vertical walls.
Figure 10:
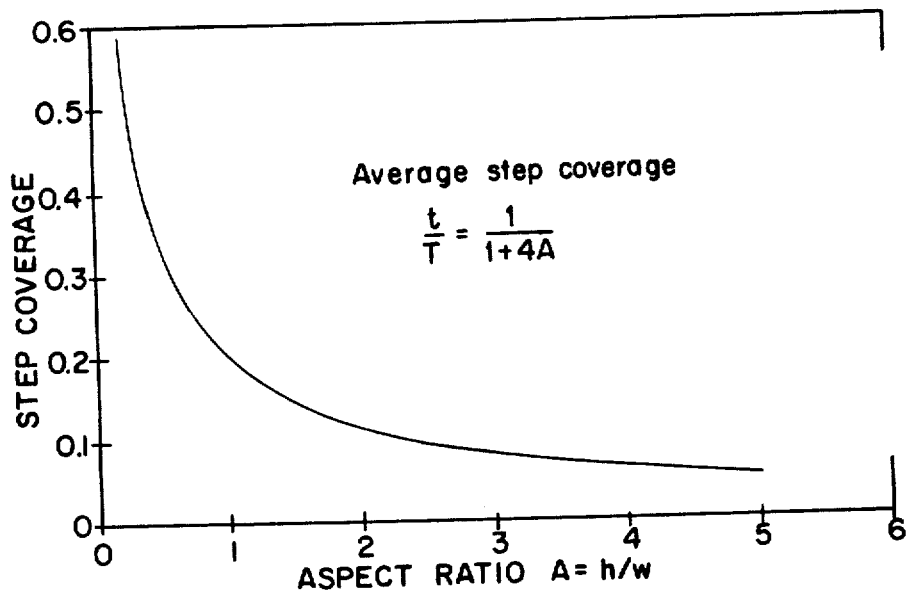
FIG. 10 is a graph which depicts theoretical maximum step coverage versus aspect ratio for a feature of with vertical walls.

According to the assumption, if these two expressions are equated, a value for step coverage can be obtained. For a square feature, i.e., $A = w^2$, with vertical walls, the step coverage, or $t/T$, becomes $w^2/(w^2+4wh)$. Using this equation, the step coverage of a square feature can be plotted against via width for a variety of feature widths and depths, as shown in FIG. 9. Step coverage can also be calculated for different values of the aspect ratio, the ratio of the feature depth h to the feature width w, as in FIG. 10. From this model, a feature with an aspect ratio of unity will have a maximum step coverage of 20% for very thin, low temperature films.

Therefore, in order to obtain a continuous film of about 200 Angstroms thick on the inner surface of the feature during the first step, about 1000 Angstroms must be deposited onto the flat surface 24 of the wafer 12. Note that for more favorable aspect ratios or favorable slopes, the 200 Angstrom film thickness may be achieved with much less than 1000 Angstroms of deposition, even as little as 400 Angstroms. In features with irregularities on the sidewalls, a continuous film can only be formed at greater thicknesses than 200 Angstroms. In such cases the deposition thickness may be as much as 2000 Angstroms.

During the first step, every attempt is made to use the highest deposition rate possible, since this improves throughput, resistivity, reflectivity, and grain size. This rate is preferably about 220 Angstroms per second, and is achieved by controlling the power to the target 13. Depending upon the past life of the target, this power is preferably in the range of about 20 KW to 29 KW. If the target is relatively new and unused, the power necessary to achieve the desired deposition rate will probably be in the lower part of the range, i.e., closer to 20 KW. However, as the target is consumed, higher power must be applied to achieve the desired rate.

On the other hand, the deposition rate during the second step is set at rate preferably about one fifth of the rate used during the first step, or about 44 Angstroms per second, and can be achieved by reducing power to the target 13 to about one fifth of its original value. The duration and deposition rate of the second step is determined according to a theoretical maximum diffusion length and the amount of heat, i.e., the temperature, applied to the wafer.

At room temperature, mobility is so low that step coverage cannot be improved by any surface diffusion mechanism. Thus, while a continuous film can be formed at room temperature, the step coverage during the first step will be governed primarily by geometry. If the entire deposition is performed under these conditions, the growing layer will soon cause shadowing. In order to planarize, or nearly completely fill the feature, mobility through the application of heat and/or bias must be added during subsequent steps.

To utilize surface diffusion during the second step of this process, the deposition rate must be reduced. The deposited atoms move about the surface at a rate determined by the temperature, for a duration, or lifetime, that is limited to the length of time it takes for these atoms to be buried by subsequently deposited atoms. This lifetime can be calculated as:

$$Y = na/r \qquad \text{Eq III}$$

where n is the number of monolayers required to bury the mobile atoms, a is the monolayer thickness, and r is the deposition rate. During the lifetime, the mobile atoms will move a characteristic distance, L, defined by:

$$L = \sqrt{D\gamma} \qquad \text{Eq IV}$$

and where D is the surface diffusion coefficient. The distance L is related, in this process, to the dimensions of the feature, since planarization requires the motion of the mobile atoms into the feature. Assuming that the atom must move a distance equal to the depth and the half-width of the feature to fill it up, the characteristic distance L can be expressed as:

$$L = h + w/2 \qquad \text{Eq V}$$

By substitution, now the deposition rate can be expressed as follows:

$$r = \frac{Dna}{(h + w/2)^2} \qquad \text{Eq VI}$$

The diffusion coefficient D has the form
$$D = D_o \exp(-E_a/kT) \qquad \text{Eq VII}$$

where $D_o$ is a constant, k is Boltzmann's constant, $E_a$ is the activation energy for surface diffusion (about 0.5 eV for Aluminum), and T is the absolute temperature. Now $$r = \frac{D_o na}{(h + w/2)^2} \exp(-E_a/kT) \qquad \text{Eq VIII}$$

Our experimental work has shown for h=1 micron, w=1 micron, at 450° C., a successful second step occurs with a deposition rate of 45 A/sec. Thus the lumped constants can be estimated as:

$$D_o na = 31 \text{ micron}^3 \text{sec} \qquad \text{Eq IX}$$

Using this constant, the deposition rate can be calculated for other feature dimensions and temperatures.

Figure 11:
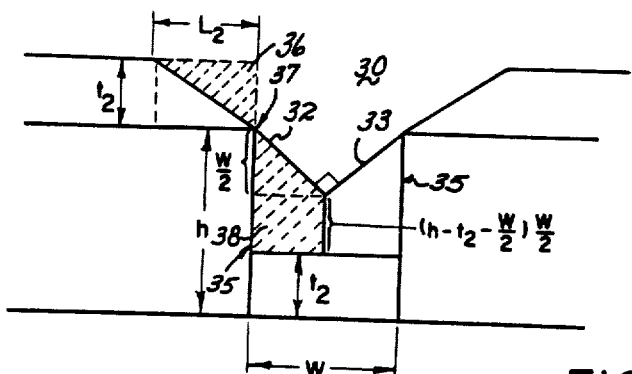
FIGS. 11 and 12 are schematics showing a cross sectional view of a feature to be metallized and which demonstrate a theoretical model used to calculate coverage thickness achieved during a second step of the inventive process, each of the Figures having a different aspect ratio.
Figure 12:
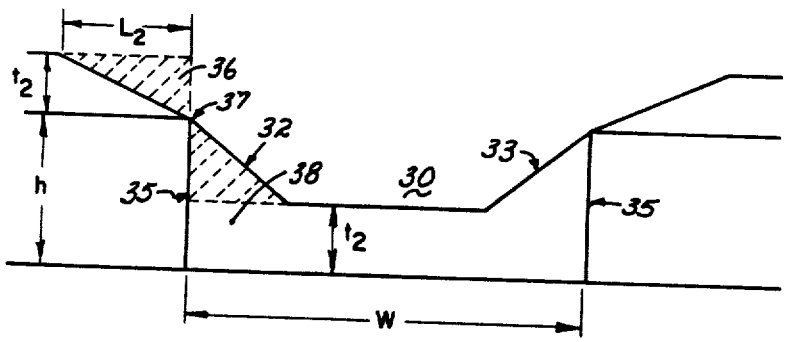
Figure 13:
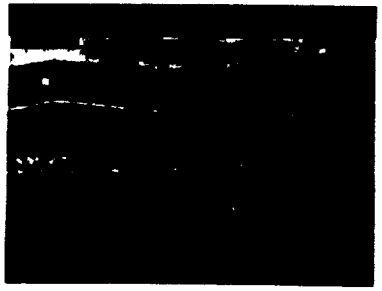
FIGS. 13–18 are photographs which show cross sectional views of different feature sizes after the preferred embodiment of this inventive method has been applied under varying second step thicknesses. The sizes are labelled on the Figs.
Figure 14:
Figure 15:

The thickness, $t_2$, that is required for the second step, can be estimated from a consideration of the volume of deposited material that must be redistributed from the area surrounding the feature to establish a favorable surface configuration inside the feature. This configuration may be any one of a number of hypothetical cases. Two such hypothetical cases are shown in FIG. 11 and FIG. 12, and these cases are used to derive an expression for thickness $t_2$ used in the second step of this inventive process. The choice of which of these two cases to use depends on the aspect ratio of the feature.

FIG. 11 shows a feature 30 which has an aspect ratio greater than unity. In FIG. 11, the feature 30 has been filled to the extent the deposited material defines a hollow cone defined by walls 32 and 33 and with a 90° apex angle that extends down into the feature 30 from the original side surfaces 35 of the feature 30. Although the details of the motion of material during the redistribution are unknown, this configuration can be used to estimate the distance the material moves during the redistribution. The material that moves into the feature 30 can be assumed to come from a void 36 formed in the layer of material deposited during the second step. The void 36 has the shape of a conical annulus (with triangular cross section) that extends from the periphery 37 of the feature 30 a distance equal to the distance that an atom will move, which was defined earlier as L. In other words, the characteristic distance L forms one leg of the triangularly shaped void 36.

For simplification, this case can be reduced to a two-dimensional problem, which would be strictly applicable to the planarization of trench features with this particular aspect ratio. It is assumed that there is a balance between the cross sectional area 38 that is filled in the feature 30 and the cross sectional area of the void 36 from where the redistributed material originated. These cross sectional areas are shaded in FIGS. 11 and 12. This assumption that the area of void 36 equals the area 38 in the feature results in the following equation:

$$\tfrac{1}{2} L t_2 = w/2(h - t_2 - w/2) + w^2/8 \qquad \text{Eq X}$$

From which an expression for $t_2$ can be obtained, as follows:

$$t_2 = \frac{w(h - w/4)}{L + w} \qquad \text{Eq XI}$$

Since the redistribution of material is by surface diffusion, the expression for L in Equation IV can be substituted into Equation XI. By first combining Equations III and IV to obtain the following expression:

$$L = c\sqrt{D} = c\sqrt{Dna/r} \qquad \text{Eq XII}$$

with c being a constant of proportionality, and then substituting Equation XII into Equation XI, the following expression is obtained:

$$t_2 = \frac{w(h - w/4)}{c\sqrt{Dna/r} + w} \qquad \text{Eq XIII}$$

When D is replaced by its equivalent expression in temperature, and the earlier obtained expression for r is substituted, the following expression is obtained:

$$t_2 = \frac{w(h - w/4)}{c\left(h + \frac{w}{2}\right) + w} \qquad \text{Eq XIV}$$

In other words, temperature dependence drops out, and the thickness $t_2$ for second step deposition is a factor of the geometry of the feature to be planarized. From the same experimental data that was used earlier to calculate the appropriate deposition rate, a good planarization results were achieved with $t_2 = 3000$ A. Thus, the constant can be estimated as:

$$c = 1.0 \text{ (dimensionless)}$$

Now both the rate and the thickness for the second step can be estimated, given the temperature of the process, and the height and width of the feature. Using these expressions for rate and thickness, the required duration of the second step deposition can also be calculated.

The derived expressions for rate and thickness $t_2$ apply for the feature shown in FIG. 11, which has an aspect ratio greater than unity. Features with different cross sectional shapes will generate different material balance equations. For instance, FIG. 12 shows a feature with an aspect ratio that is much less than unity. With the same assumptions made for the derivation of Equation XIV, an expression for thickness, $t_2$, can be arrived at for the feature in FIG. 12. Omitting all the details, the final expression turns out to be:

$$t_2 = \tfrac{1}{4}(3h + w/2 - \sqrt{5h^2 + 3hw + w^2/4}). \quad \text{Eq XV}$$

The third step involves deposition at a normally high rate, preferably in the same range used for the first step, i.e., approximately 200-220 A/second, to achieve the final desired thickness. The duration of the third step deposition will depend upon the final desired thickness and the amount of material already deposited during Steps 1 and 2.

In summary, the invention process involves:

Step 1: Deposit 1000 A of material (more or less according to aspect ratio) at a high deposition rate with low temperature to suppress nucleation.

Step 2: Deposit to a thickness $t_2$ at a reduced deposition rate and with deposition occurring at a high temperature to enhance surface diffusion. The thickness, rate and, ultimately, the duration of deposition during this step are calculated from the height and width of the feature, and indirectly, from the temperature of the heat applied to the wafer.

Step 3: Deposit additional material to a thickness according to the final desired thickness, with deposition occurring at a high deposition rate and with high temperature.

Note, finally, that practical considerations will limit the application of this invention to a certain range of feature sizes and aspect ratios. The step coverage at low temperatures is limited by the aspect ratio. Moreover, the volume required to fill very large features may require unusually low deposition rates and second step thicknesses beyond that desired for the total deposition.

Figure 16:
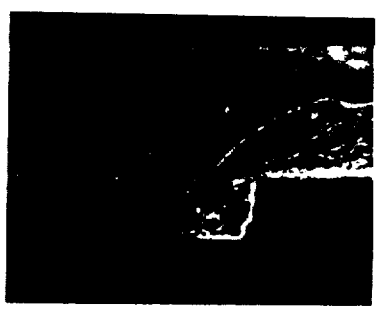
Figure 17:
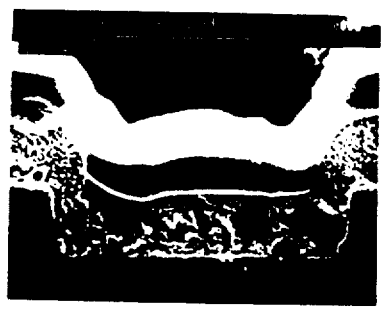
Figure 18:
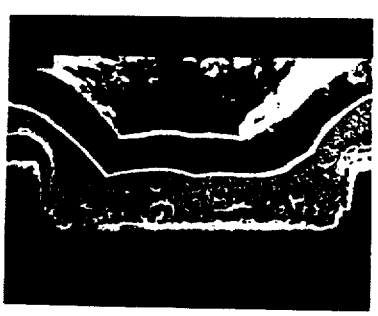

FIGS. 13 through 18 show the dramatic effects of changing the duration of the second step deposition. The Figures on the left, i.e., 13-15, show the results of a "minimum" second step, requiring about 15 seconds to achieve a 660 A thickness (or about 44 Angstroms/sec). This duration was calculated from a thermal model of the time required to bring the wafer 12 up to the temperature of the back plane member 15. The Figures on the right, i.e., FIGS. 16-18, show a second step of longer duration, with a 60 second duration used to achieve a 3000 A thickness (at a rate of about 50 A/sec). The effects produced by deposition steps of intermediate duration can be interpolated. Thus, it appears the sixty second deposition time is much more than is required to heat the wafer to its maximum temperature, so it can be concluded that the longer deposition thickness is responsible for better planarization, regardless of whether the process is viewed as metal-volume delivery or diffusion-distance.

It has been found that the diffusion processes are active at temperatures about 300° C. No wafer bias is used during the first step because it is of too short a duration to establish a stable sputtering process. Bias is also not usually used in the second step because it may raise the electrical resistivity. Bias on the third step has been used to modify film characteristics such as grain size and structure. For instance, bias during the third step helps to raise the temperature as much as 30° C. more than the unbiased deposition alone, and at 150-250 v it improves the surface texture of the film. There are no indications that it improves planarization through resputtering.

To summarize the sequence of steps used to carry out the inventive method with the Eclipse machine, during a first step of high rate deposition, about 400-1000 Angstroms of aluminum are deposited onto the wafer 12, thereby producing a continuous film that serves as the base material for subsequent planarization. The duration of this first step is about 0.077 minutes, or about 4½ to 5 seconds, and results in a substantially uniform step coverage of about 200 Angstroms on the inside surfaces of the features of the wafer. It is achieved by applying high power, i.e., 25 KW, to the target 13.

Immediately following the first step, back plane gas is used to thermally connect the heated back plane member 15 to the rear of the wafer 13. With heat applied, power to the target 13 is reduced to about 3 kilowatts in order to obtain reduced rate deposition, preferably about one fifth of the deposition rate used in the first step. The depth and the half-width of the feature to be planarized are used to determine a characteristic distance that the deposited atoms must move in order to fill the feature. The characteristic distance, along with the temperature of the applied heat, are used to determine first the rate of deposition and ultimately, the duration of the second step. The thickness of the second step deposition is determined solely by the feature geometry, i.e., the depth and width.

During the third step, the wafer 12 remains thermally connected to the heated back plane while high power, high rate deposition is resumed until the final desired thickness is achieved. The duration of the third step depends upon the final desired thickness of material, and the amount of material already deposited during the first and second steps. Preferably, depositing is continuous and uninterrupted from commencement of the first step until completion of the third step.

While a preferred embodiment of the invention has been described, applicant does not wish to be limited thereby, and it is to be understood that various modifications could be made without departing from the spirit of the invention. Accordingly, it is to be understood that changes may be made without departing from the scope of the invention as particularly set out and claimed.

We claim:

1. A method of planarizing a feature of a wafer with an aluminum or an aluminum alloy material comprising the steps of:
   (a) depositing said material onto said wafer at a first deposition rate for a first time interval;
   (b) depositing said material onto said wafer at a second deposition rate that is less than said first deposition rate while simultaneously applying heat to said wafer during a second time interval; and
   (c) depositing said material onto said wafer at a higher deposition rate than said second deposition rate while continuing to apply heat to said wafer during a third time interval, thereby to planarize said feature.

2. The method of claim 1 wherein said material is continuously deposited onto said wafer from commencement of said first time interval until completion of said third time interval.

3. The method of claim 1 wherein said first time interval is predetermined and said material is deposited onto a flat surface of said wafer during said first predetermined time interval to a thickness in the range of about 400 Angstroms to about 2,000 Angstroms, thereby to produce a substantially uniform distribution of material having a thickness of about 200 Angstroms upon inner surfaces of said feature.

4. The method of claim 1 wherein said material is transferred by sputtering from a target mounted opposite said wafer and said deposition rate is controlled by the application of electrical power to negatively bias said target with respect to the chamber.

5. The method of claim 1 wherein said first deposition rate is about 220 Angstroms per second.

6. The method of claim 1 wherein the wafer is heated to a temperature of at least 300° C. during said second and third time intervals.

7. The method of claim 6 wherein said wafer is heated via a thermally conductive gas flow between a heated back plane and said wafer.

8. The method of claim 1 wherein said second deposition rate is about 44 Angstroms per second.

9. The method of claim 1 and further comprising the step of:
applying bias to said wafer during the third time interval.

10. The method of claim 1 wherein the rate of deposition during said first time interval is equal to the rate of depositing during said third time interval.

11. The method of claim 1 wherein said second deposition rate is dependent upon both the temperature of said wafer under said applied heat and upon the height and the width of said feature to be planarized.

12. The method of claim 1 wherein the thickness of material deposited during step (b) is dependent upon the width and the height of said feature 13. The method of claim 1 wherein step (b) is performed for a duration calculated from theoretical values obtained for said second deposition rate and a second deposition thickness achieved during step (b), said second deposition rate being dependent upon the height and width of said feature and upon the temperature of said wafer under said applied heat, and said second deposition thickness being dependent upon said height and width of said feature.

14. The method of claim 1 wherein the duration of deposition during step (c) is determined by a final desired thickness and the total amount of material deposited during steps (a) and (b).

15. A method of planarizing a feature of a wafer with an aluminum or aluminum alloy material comprising the steps of:
sputtering the material from a target mounted opposite the wafer onto the wafer at a rate of about 220 Angstroms per second in the absence of heat in order to produce on a flat surface of said wafer a layer of said material having a thickness in the range of about 400 to 2000 Angstroms; followed by,
sputtering the material onto the wafer at a reduced rate of about 44 Angstroms per second while supplying heat to the wafer, said reduced rate sputtering being performed for a predetermined duration; followed by, .
sputtering the material onto the wafer at a rate of about 220 Angstroms per second with continued supply of said heat until said feature is substantially planarized.

16. The method of claim 15 wherein said heat supplied to said wafer during said second and third steps is above 300° C.

17. The method of claim 15 wherein the rate of said sputtering during said first, said second and said third steps is controlled by the power applied to said target.

18. The method of claim 15 wherein said predetermined duration depends upon values calculated for deposition rate and thickness, said calculated rate value being dependent upon the depth and the width of the feature and the temperature of said applied heat and said thickness value being dependent upon the depth and the width of said feature.

19. The method of claim 15 wherein sputtering during said third step is performed for a duration determined by a final desired deposition thickness and by the total amount of material deposited during the prior, second and the third sputtering steps.

* * * * *

UNITED STATES PATENT AND TRADEMARK OFFICE
CERTIFICATE OF CORRECTION

PATENT NO. : 4,994,162                  Page 1 of 5
DATED       : February 19, 1991
INVENTOR(S) : Karl J. Armstrong, et al It is certified that error appears in the above-indentified patent and that said Letters Patent is hereby corrected as shown below:

The drawing sheets consisting of Figs. 5-18, should be added as shown on the attached page.

Signed and Sealed this

Eighteenth Day of January, 1994

Attest:

BRUCE LEHMAN

*Attesting Officer*          *Commissioner of Patents and Trademarks*

NUCLEATION OF 250A PURE ALUMINUM ON Ti/TiN/Ti
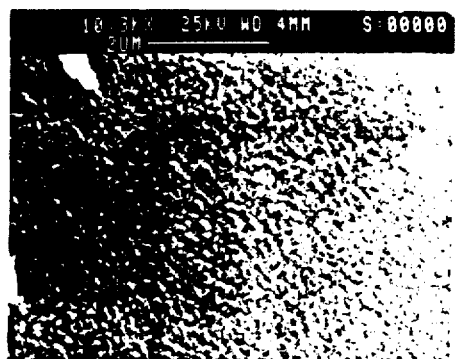
200C FIG. 5
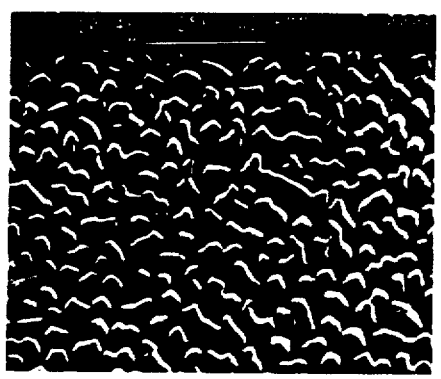
300C FIG. 6
400C FIG. 7
500C FIG. 8

MRC ECLIPSE 3 STEP PLANRIZATION

SECOND STEP AT 660A  SECOND STEP AT 3000A 1.2u Vias

2u Vias 4.5u Vias

EFFECT OF SECOND STEP VARIATIONS IN 3-STEP PROCESS